(12) United States Patent
Huang

(10) Patent No.: US 6,654,304 B1
(45) Date of Patent: Nov. 25, 2003

(54) POLY FUSE TRIM CELL

(75) Inventor: Yuhong Huang, Mountain View, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/179,157

(22) Filed: Jun. 25, 2002

(51) Int. Cl.$^7$ ................................................. G11C 7/00
(52) U.S. Cl. .................................... 365/225.7; 365/525
(58) Field of Search ............................... 365/225.7, 96, 365/196; 327/525, 526

(56) References Cited

U.S. PATENT DOCUMENTS

| | | | | | |
|---|---|---|---|---|---|
| 5,047,664 | A | * | 9/1991 | Moyal | 327/566 |
| 5,384,727 | A | * | 1/1995 | Moyal et al. | 365/96 |
| 5,412,594 | A | * | 5/1995 | Moyal et al. | 365/96 |
| 6,157,241 | A | * | 12/2000 | Hellums | 327/525 |

OTHER PUBLICATIONS

Precision CMOS Single Supply Rail–to–Rail Input/Output Wideband Operational Amplifiers, Analog Devices, Inc., AD8601/AD8602/AD8604, pp. 1–16, (2000).

Preliminary Technical Data, Precision Low Noise CMOS Rail–to–Rail Input/Output Operational Amplifiers, Analog Devices, Inc., AD8605/AD8606/8608, pp. 1–4, (1997).

* cited by examiner

*Primary Examiner*—Anh Phung
(74) *Attorney, Agent, or Firm*—Koppel, Jacobs, Patrick & Heybl

(57) ABSTRACT

A poly fuse trim cell includes a poly fuse and a transistor connected together at a first node; the transistor conducts a current necessary to blow the fuse in response to a control signal. The cell also includes a switching transistor, connected between the first node and a current source circuit. A logic gate is connected to the first node at one input, and to a reset signal at a second input. The output of the logic gate provides the trim cell's output, and controls the switching transistor. When the fuse is intact, the logic gate output is "low" such that the switching transistor is off and the cell's quiescent current is zero. When the fuse is blown, the logic gate output goes "high" upon the occurrence of a reset signal, which turns on the switching transistor and allows the current source circuit to pull down the first node.

16 Claims, 2 Drawing Sheets

POLY FUSE TRIM CELL

BACKGROUND OF THE INVENTION

1. Field of the Invention

This invention relates to the field of trimming circuits, and particularly to poly fuse trim cells.

2. Description of the Related Art

Poly fuse trim cells are used in many applications in which it is necessary to permanently program the digital values of one or more bits. For example, an 8-bit digital-to-analog converter (DAC) might be employed to provide a correction voltage to a particular circuit. Eight poly fuse trim cells could be programmed to provide the eight digital input bits to the DAC which cause it to produce the desired correction voltage.

A typical poly fuse trim cell is shown in FIG. 1. A poly fuse F1 is connected in series with a transistor MN0 at a node 10, with F1 and MN0 connected between supply rails VDD and GND. In response to a TRIM control signal (preferably buffered with one or more inverters U1, U2), MN0 conducts a current sufficient to cause F1 to "blow" and become an open-circuit. A current source circuit 12 is connected to node 10; circuit 12 is made of a transistor MN1, which provides a small current I1 (such as 2–5 uA) in response of a bias voltage VB. An inverter U3 inverts the logic level at node 10 and presents it at its output, which serves as the output OUT of the trim cell.

In operation, when the fuse is intact, the current through F1 (I1) causes a very small voltage drop across F1, and makes node 10 about equal to VDD ("high"), with the output of inverter U3 producing a logic "low" at OUT. When the fuse has been blown open by asserting the TRIM signal, the current I1 pulls node 10 down to near GND ("low"), making OUT a logic "high". In this way, the state of OUT is "programmed" by either blowing F1 open or leaving it intact.

One drawback of this approach is that, for cells having fuses that are to remain intact (i.e., cells programmed to permanently produce a "low"), the pull-down current I1—while insufficient to affect the logic level of node 10—still exists as a quiescent current $I_Q(=I1)$ that flows through F1 and MN1. This can pose a problem when a number of such trim cells are used in a low power application. For example, if 20 poly fuse trim cells are used on a particular integrated circuit, the current consumption just for these cells can be 40–100 $\mu A$, which may be unacceptably high.

SUMMARY OF THE INVENTION

A poly fuse trim cell is presented which overcomes the problems noted above, reducing or eliminating the quiescent current of cells having intact poly fuses.

The present poly fuse trim cell includes a poly fuse and a transistor connected together at a first node; as before, the transistor conducts a current necessary to blow open the fuse in response to a control signal. The cell also includes a current source circuit, a switching transistor, and a two-input logic gate; the switching transistor's current circuit is connected between the first node and the current source circuit. The logic gate is connected to the first node at one input, and to a reset signal at its second input. The output of the logic gate provides the output of the cell, and is also connected to control the switching transistor.

The current source circuit, logic gate and switching transistor form a latch. In operation, when the fuse is intact, the logic gate output is in a logic "low" state such that the switching transistor is off (assuming an N-type transistor). This prevents current flow through the current source circuit, thereby making the cell's quiescent current zero when it's fuse is intact. When the fuse is blown open, the logic gate output goes "high" upon the occurrence of a reset signal, which turns on the switching transistor and allows the current source circuit to pull down the first node. In this way, the current consumption of a cell or a plurality of cells is reduced when compared with the prior art cell, assuming that the poly fuses of at least some of the trim cells remain intact.

Further features and advantages of the invention will be apparent to those skilled in the art from the following detailed description, taken together with the accompanying drawings.

DETAILED DESCRIPTION OF THE INVENTION

Figure 1:
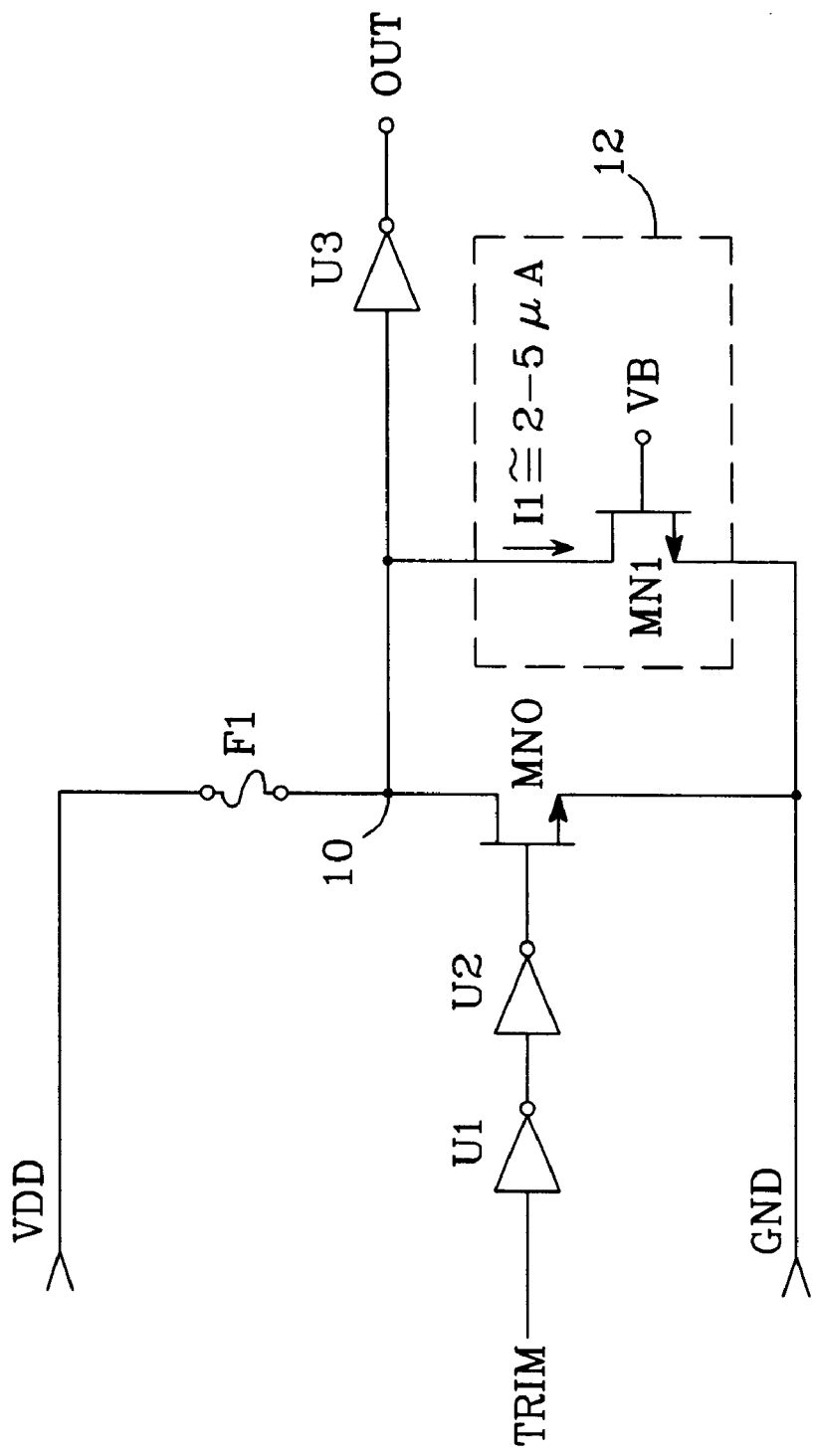
FIG. 1 is a schematic diagram of a known poly fuse trim cell.
Figure 2:
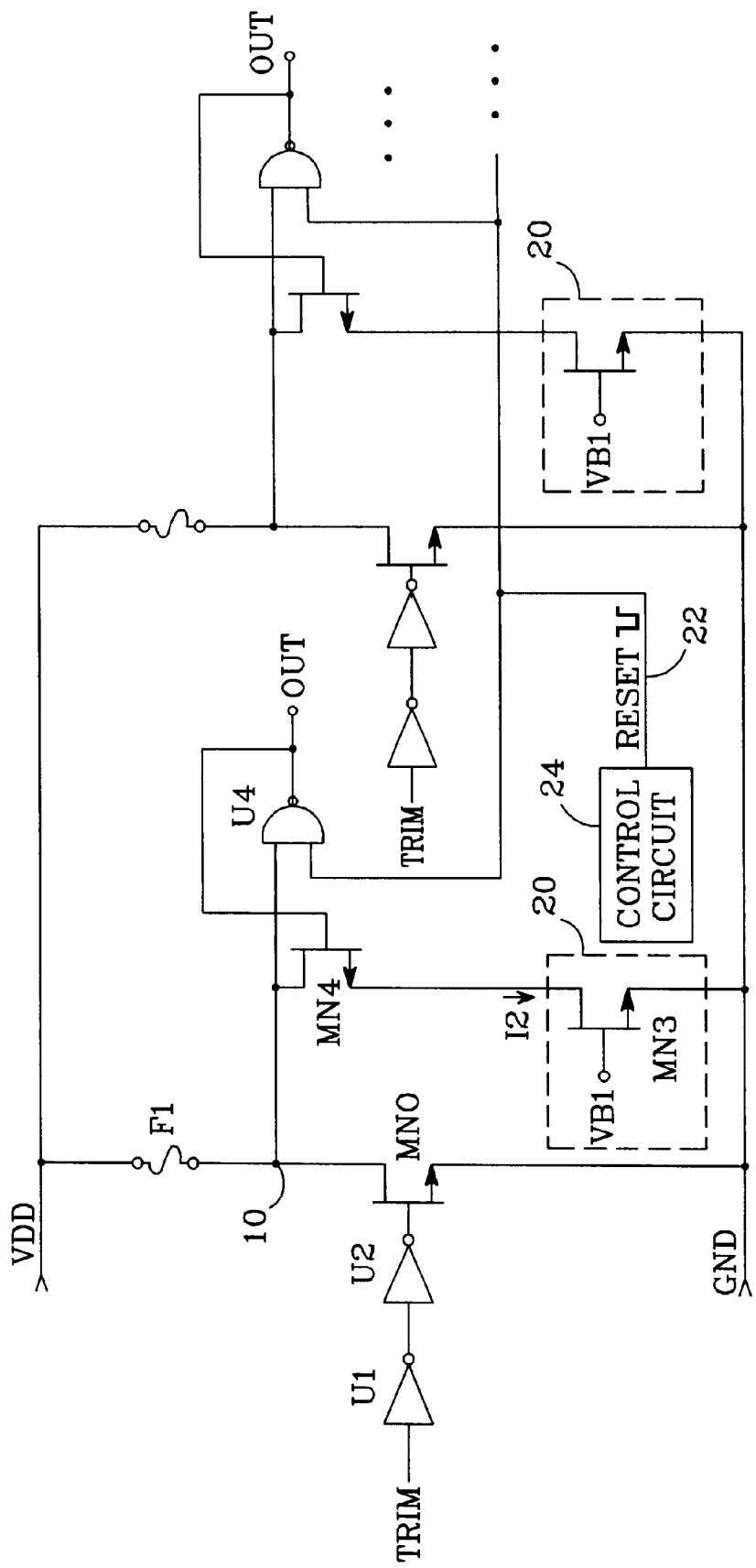
FIG. 2 is a schematic diagram of a poly fuse trim cell per the present invention.

A poly fuse trim cell in accordance with the present invention is shown in FIG. 2. As above, the trim cell includes a poly fuse F1 connected in series with the drain-source circuit of transistor MN0 at first node 10; MN0 conducts a current sufficient to blow open F1 in response to a TRIM control signal applied to MN0's gate (preferably buffered with one or more inverters U1, U2). F1 and MN0 are connected between two supply rails, such as VDD and GND in the example shown in FIG. 2.

The present poly fuse trim cell also includes a current source circuit 20 made from a transistor MN3, which provides a current I2 in response to a bias voltage VB1.

The drain-source circuit of a switching transistor MN4 is connected between first node 10 and current source circuit 20. When turned on, MN4 allows current I2 to pull down on first node 10. However, when turned off, MN4 prevents current from being drawn through current source circuit 20.

The novel poly fuse trim cell also includes a two-input logic gate U4. One input of U4 is connected to first node 10, and U4's other input is connected to receive a RESET signal 22. The logic gate's output is connected to the gate of switching transistor MN4, and serves as the trim cell's output OUT. The logic gate is arranged so that its output changes state and turns on MN4 if either of its inputs is in a logic "low" state. In this example, U4 is a NAND gate, and RESET is nominally "high" and goes "low" to perform a reset (explained below).

In operation, when F1 is intact, current through F1 causes first node 10 to be at a logic "high". The reset signal is also nominally "high", such that the output of NAND gate U4 is "low". The output of NAND gate U4 is the trim cell's output OUT, with a "low" indicating that fuse F1 is intact.

The "low" output of U4 is also connected to the gate of MN4, which keeps MN4 turned off. As a result, no current flows through MN4, which in turn prevents any quiescent current from flowing through current source circuit 20 when F1 is intact.

When the TRIM input is toggled such that MN0 is turned on and fuse F1 is blown open, the voltage at node 10 will be indeterminate until MN4 is turned on. This occurs when RESET is toggled from its nominal "high" state to its reset "low" state. When RESET goes "low", the output of U4 is forced "high", which turns on MN4. This allows current I2 from current source circuit 20 to pull down on node 10. If F1 is blown open, node 10 is pulled down to the GND supply rail. When this happens, the output of U4 will remain high even after RESET returns to its nominal "high" state. In this way, after the occurrence of a RESET signal, the output OUT of NAND gate U4 indicates whether F1 is intact (OUT=low) or open (OUT=high). Furthermore, with node 10 pulled down to GND (when F1 is blown), no current flows in MN4 or MN3. Thus, current consumption is minimized when fuse F1 is in either its intact or open states.

The RESET signal is provided by a control circuit 24. A system would typically include a plurality of poly fuse trim cells (two such cells are shown in FIG. 2), each of which receives the RESET signal, and would be arranged to periodically determine the state of each trim cell's output; control circuit 24 toggles RESET prior to each such determination. For example, a system may need to know the state of each of its trim cell fuses every time it is powered-up. In this case, control circuit 24 is arranged to toggle RESET each time the system is powered-up.

The reduction of quiescent current, particularly for trim cells having intact fuses, provides a significant benefit over the prior art. The cumulative current consumption for a plurality of prior art poly fuse trim cells might be unacceptably high for some low power applications. With the reduction in quiescent current provided by the invention, a given system might be able to accommodate more trim cells, or be able to function longer than would a system employing a comparable number of prior art cells.

Note that, if a fuse F1 is not completely blown open, there will be some current flowing through MN4 and MN3, with the amount of current given by $VDD/R_{open}$—where $R_{open}$ is the resistance of the partially blown fuse. Though this current would tend to be small, it would prevent the voltage at node 10 from being pulled all the way down to GND, and current consumption for the cell would not be zero (as it would be if F1 were completely blown).

Further note that, even when a fuse F1 is completely blown, some finite current flows through MN4 and MN3 due to leakage through the input of NAND gate U4. However, when U4 is implemented with MOS transistors, such leakage tends to be less than 1 pA and is thus negligible.

It is not essential that the present poly fuse trim cell be powered by a positive supply voltage VDD and ground GND. For example, the GND rail might be at a non-zero potential, or an opposite polarity version of the trim cell might be implemented between GND and a negative supply voltage.

Note that though the invention is shown as implemented with NMOS transistors, the present trim cell could also be implemented with PMOS transistors. In addition, though shown implemented with FETs, the present poly fuse trim cell could also be implemented with bipolar transistors; however, the current consumption of a cell with a blown fuse is likely to be higher than that of a corresponding FET version, due to the higher leakage current found at a bipolar NAND gate's input terminal.

While particular embodiments of the invention have been shown and described, numerous variations and alternate embodiments will occur to those skilled in the art. Accordingly, it is intended that the invention be limited only in terms of the appended claims.

I claim:

1. A poly fuse trim cell, comprising:
    a poly fuse having intact and open states, said poly fuse capable of being opened by conducting a first current through it,
    a first transistor, the current circuit of which is connected in series with said fuse at a first node, said first transistor arranged to conduct said first current and thereby open said poly fuse in response to a control signal,
    a current source circuit which provides a second current,
    a switching transistor, the current circuit of which is connected between said first node and said current source circuit such that the voltage at said first node is pulled to a known value by said second current when said fuse is open and said switching transistor is on, and such that said trim cell draws negligible current when said switching transistor is off, and
    a logic gate connected to said first node at one input and to a reset signal at a second input, said reset signal having nominal and reset states, said logic gate arranged to toggle its output from a first state to a second state if said first node is pulled to said known value or if said reset signal is in said reset state, said logic gate's output connected to control said switching transistor, said logic gate and said switching transistor arranged such that said switching transistor is turned on when said logic gate's output is in said second state.

2. The poly fuse trim cell of claim 1, wherein said current source circuit comprises a second transistor having its current circuit connected to said switching transistor and which conducts said second current in response to a bias voltage.

3. The poly fuse trim cell of claim 1, wherein the side of said poly fuse opposite said first node is connected to a first supply rail and the side of said first transistor opposite said first node is connected to a second supply rail, said current source circuit connected between said switching transistor and said second supply rail such that the voltage at said first node is pulled to said second supply rail by said second current when said fuse is open and said switching transistor is on.

4. The poly fuse trim cell of claim 3, wherein said first supply rail is at a positive voltage VDD and said second supply rail is at a voltage GND less than VDD, wherein said logic gate is a NAND gate and said reset signal's nominal state is a logic "high" and its reset state is a logic "low" such that said NAND gate's output toggles from a logic "low" to a logic "high" if said first node is pulled to GND or if said reset signal is in said reset state, and said NAND gate's output is a logic "low" if said fuse is intact and said reset signal is in said nominal state.

5. The poly fuse trim cell of claim 4, further comprising a control circuit which generates said reset signal and is arranged to toggle said reset signal from said nominal state to said reset state to said nominal state, said reset signal at least temporarily causing said NAND gate's output to go to a logic "high" state such that said switching transistor is turned on, such that if said fuse is intact then said NAND gate's output is in a logic "low" state after said reset signal is toggled, and if said fuse is open then said NAND gate's output is in a logic "high" state after said reset signal is toggled.

6. The poly fuse trim cell of claim 4, wherein said first transistor and said switching transistor are NMOS FETs.

7. The poly fuse trim cell of claim 1, further comprising at least one inverter interposed between said control signal and said first transistor to buffer said control signal.

8. A poly fuse trim cell, comprising:
- a poly fuse having intact and open states, said poly fuse capable of being opened by conducting a first current through it,
- a first transistor, the current circuit of which is connected in series with said fuse at a first node, said poly fuse and said first transistor connected between first and second supply rails, said first transistor arranged to conduct said first current and thereby open said poly fuse in response to a control signal,
- a current source circuit comprising a second transistor which provides a second current in response to a bias voltage,
- a switching transistor, the current circuit of which is connected between said first node and said current source circuit, said current source circuit and said switching transistor arranged such that the voltage at said first node is pulled to said second supply rail by said second current when said fuse is open and said switching transistor is on, and such that said trim cell draws negligible current when said switching transistor is off, and
- a logic gate connected to said first node at one input and to a reset signal at a second input, said reset signal having nominal and reset states, said logic gate arranged to toggle its output from a first state to a second state if said first node is pulled to said second supply rail or if said reset signal is in said reset state, said logic gate's output connected to control said switching transistor, said logic gate and said switching transistor arranged such that said switching transistor is turned on when said logic gate's output is in said second state.

9. The poly fuse trim cell of claim 8, wherein said first supply rail is at a positive voltage VDD and said second supply rail is at a voltage GND less than VDD, wherein said logic gate is a NAND gate and said reset signal's nominal state is a logic "high" and its reset state is a logic "low" such that said NAND gate's output toggles from a logic "low" to a logic "high" if said first node is pulled to GND or if said reset signal is in said reset state, and said NAND gate's output is a logic "low" if said fuse is intact and said reset signal is in said nominal state.

10. The poly fuse trim cell of claim 9, wherein said first transistor, said second transistor, and said switching transistor are NMOS FETs.

11. The poly fuse trim cell of claim 9, further comprising a control circuit which generates said reset signal and is arranged to toggle said reset signal from said nominal state to said reset state to said nominal state, said reset signal at least temporarily causing said NAND gate's output to go to a logic "high" state such that said switching transistor is turned on, such that if said fuse is intact then said NAND gate's output is in a logic "low" state after said reset signal is toggled, and if said fuse is open then said NAND gate's output is in a logic "high" state after said reset signal is toggled.

12. The poly fuse trim cell of claim 8, further comprising at least one inverter interposed between said control signal and said first transistor to buffer said control signal.

13. A poly fuse trim cell system, comprising:
- a plurality of poly fuse trim cells, each of which comprises:
  - a poly fuse having intact and open states, said poly fuse capable of being opened by conducting a first current through it,
  - a first transistor, the current circuit of which is connected in series with said fuse at a first node, said poly fuse and said first transistor connected between first and second supply rails, said first transistor arranged to conduct said first current and thereby open said poly fuse in response to a control signal,
  - a switching transistor, the current circuit of which is connected between said first node and a current source circuit which provides a second current, said current source circuit and said switching transistor arranged such that the voltage at said first node is pulled to said second supply rail by said second current when said fuse is open and said switching transistor is on, and such that said trim cell draws negligible current when said switching transistor is off,
  - a logic gate connected to said first node at one input and to a reset signal at a second input, said reset signal having nominal and reset states, said logic gate arranged to toggle its output from a first state to a second state if said first node is pulled to said second supply rail or if said reset signal is in said reset state, said logic gate's output connected to control said switching transistor, said logic gate and said switching transistor arranged such that said switching transistor is turned on when said logic gate's output is in said second state, and
  - a current source circuit comprising a second transistor which provides said second current to said switching transistor, and
- a control circuit which provides said reset signal to each of said logic gates and is arranged to toggle said reset signal from said nominal state to said reset state to said nominal state, said reset signal at least temporarily causing each logic gate output to go to its second state such that said switching transistors are turned on, such that if a trim cell's fuse is intact then its logic gate output is in said first state after said reset signal is toggled, and if a trim cell's fuse is open then its logic gate output is in said second state after said reset signal is toggled.

14. The poly fuse trim cell system of claim 13, wherein said first supply rail is at a positive voltage VDD and said second supply rail is at a voltage GND less than VDD, wherein said logic gates are NAND gates and said reset signal's nominal state is a logic "high" and its reset state is a logic "low" such that, for each trim cell, said cell's NAND gate output toggles from a logic "low" to a logic "high" if its first node is pulled to GND or if said reset signal is in said reset state, and said cell's NAND gate output is a logic "low" if its fuse is intact and said reset signal is in said nominal state.

15. The poly fuse trim cell system of claim 14, wherein said first transistors, said second transistors, and said switching transistors are NMOS FETs.

16. The poly fuse trim cell system of claim 13, each trim cell further comprising at least one inverter interposed between the cell's control signal and its first transistor to buffer said control signal.

* * * * *